United States Patent [19]

Kobayashi

[11] Patent Number: 5,261,775
[45] Date of Patent: Nov. 16, 1993

[54] IC TEST EQUIPMENT

[75] Inventor: Yoshihito Kobayashi, Gyoda, Japan
[73] Assignee: Advantest Corporation, Tokyo, Japan
[21] Appl. No.: 767,892
[22] Filed: Sep. 30, 1991

[30] Foreign Application Priority Data

Oct. 1, 1990 [JP] Japan .................................... 263454

[51] Int. Cl.⁵ ............................................. B07C 5/344
[52] U.S. Cl. .................................... 414/403; 209/573;
   209/909; 414/783; 414/222; 324/158 F
[58] Field of Search ............... 414/403, 404, 416, 798,
   414/798.1, 754, 757, 763, 773, 783, 758, 417,
   222; 193/44; 209/573, 909; 221/11; 324/158 F;
   53/367, 392, 255, 473, 248, 235; 29/741, 759,
   834

[56] References Cited

U.S. PATENT DOCUMENTS

| | | | |
|---|---|---|---|
| 4,234,418 | 11/1980 | Bolssicat | 209/909 X |
| 4,256,429 | 3/1981 | Dwyer | 414/783 X |
| 4,588,092 | 5/1986 | Moechnig et al. | 209/573 |
| 4,715,501 | 12/1987 | Sato et al. | 209/573 |
| 4,763,811 | 8/1988 | Mae et al. | 414/403 X |
| 4,843,712 | 7/1989 | Hellstern | 414/783 X |
| 4,878,801 | 11/1989 | Pearson | 414/403 X |

FOREIGN PATENT DOCUMENTS

| | | | |
|---|---|---|---|
| 15568 | 1/1985 | Japan | 324/158 F |
| 246675 | 11/1986 | Japan | 324/158 F |

*Primary Examiner*—Frank E. Werner
*Attorney, Agent, or Firm*—Staas & Halsey

[57] ABSTRACT

In IC test equipment which has an input magazine support station for supporting a magazine discharged from an input magazine stocker and an output magazine support station for supporting a magazine into which IC elements tested in a testing station are loaded, a magazine inverting device is provided between the input magazine stocker and the input magazine support station, for turning the magazine through 90 or 180 degrees about its lengthwise direction, an IC inverting device is provided between the testing station and the output magazine support station, for turning an IC element through 90 or 180 degrees about the direction of its travel, and an IC diverter is provided whereby the orientation of the inverted IC relative to the direction of its travel is reversed and is then discharged into the magazine supported at the output magazine support station.

5 Claims, 7 Drawing Sheets

IC TEST EQUIPMENT

BACKGROUND OF THE INVENTION

The present invention relates to IC test equipment with which it is possible to test IC elements of various terminal configurations.

FIG. 1 schematically shows the construction of conventional IC test equipment. Reference numeral 100 indicates an input magazine stocker, in which are housed a number of magazines 101 each carrying IC elements to be tested. The magazines 101 housed in the magazine stocker 100 are brought up, one at a time, by lift means to an IC element feed position, where the magazine 101 is held aslant forwardly by a magazine support means 103 and is engaged at its forward end with an IC element supply port 104 of the test equipment. Then, the IC elements 105 loaded on the magazine 101 slide down therefrom by their own weight and they are fed one by one, by an escape mechanism 106, into a distributor 107.

The distributor 107 distributes the IC elements 105 fed thereinto on one of several IC element guide rail to, for example, eight IC elements guide rails. That is, the IC test equipment has 8 to 36 IC elements rails disposed in parallel so that a number of IC elements can be tested simultaneously in a test station 108. By the distributor 107 the IC elements 105 discharged from the magazine 101 are distributed to the plurality of IC element guide rails.

The distributor 107 mostly lies inside a constant temperature oven 109. The constant temperature oven 109 is so designed that test temperatures can freely be set within a range of between −30° and +125°. Preheating station 111 is provided downstream of the distributor 107. The preheating station 111 has heating means and heat absorbing means in IC element guide rails, by which the temperature of each IC element guide rail is raised or lowered to the temperature of the constant temperature oven 109 so that the temperature of each IC element 105 to be fed to the test station may quickly approach the temperature of the constant temperature oven 109. Disposed downstream of the preheating station 111 is a diverter or reorienter 112, by which each IC element 105 is turned from its inclined position to drop down to a vertical guide rail 113.

The test station 108 includes, for example, eight such vertical guide rails 113 and 32 (=8×4) IC sockets, and hence is constructed so that 32 IC elements can be tested at one time. The IC elements 105, after being tested, are reoriented by a diverter 114 into a forwardly inclined disposition and discharged into a sorter 115. The sorter 115 sorts the IC elements 105 according to the results of the tests performed at the test station 108. The IC elements 105 thus sorted are discharged into the magazines 101 supported by an output magazine support 116.

When filled with IC elements to capacity, the magazines 101 supported by the output magazine support 116 are brought up by a lift and loaded into an output magazine stocker 117. At the same time, empty magazines are loaded on the output magazine support 116.

In the conventional IC test equipment the IC elements 105 are received in an inverted or upside down disposition in the magazine 101 held by the input magazine support means 103 and slide down therefrom in such an upside down inverted configuration, with their terminal pins held upright. FIGS. 2 through 6 show inverted configurations of various IC elements sliding into the magazine 101.

FIG. 2 shows the inverted sliding disposition of an IC element having DIP type terminal pins. In this case, a slit-like window 101A made in the magazine 101 faces downward. FIG. 3 shows the case of an IC element having SOJ type terminal pins, FIG. 4 the case of an IC elements having SOP type terminal pins and FIGS. 5 and 6 the case of an IC element having ZIP type terminal pins. In FIGS. 5 and 6 the direction of the window 101A is determined depending on which side of the body of the IC element bears its name. FIGS. 7 and 8 shown the cases where the ZIP type IC element slides on its one side.

The IC elements 105 discharged in the upside down, inverted, configuration from the input side slide into the output magazine support station 116 from the testing station 108. The IC elements 105 which pass through the output magazine support station 116 are turned upside down when they are loaded into the magazine 101 held at the output magazine support station 116. The reason the IC elements are fed in the inverted disposition on the input side is that they are rarely caught by guide rails irrespective of the type of their terminal pins. Thus, the IC test equipment of this kind employs an arrangement in which the IC elements are fed in the inverted disposition at least the input side.

In the conventional IC test equipment the IC elements slide in the inverted configuration in both of the input side and the output side. Consequently, the slit-like window 101A of the magazine 101 (see FIGS. 2 through 6) held at the output magazine support station 116, in particular, faces downward or sideways; so that a label indicating the name or grade of the IC element loaded on the magazine 101 cannot be seen through the window 110A. The slit-like window 101A is provided primarily for reading the label from the outside. Hence, it is particularly inconvenient to load inverted IC elements into the magazine 101 at the output side, because magazines loaded on the output magazine stocker 117 are all held in the state in which the names or grades of the IC elements received therein cannot be seen.

SUMMARY OF THE INVENTION

It is therefore an object of the present invention to provide IC test equipment in which IC elements are fed in the inverted disposition in the input side but loaded in the uninverted or one-sided disposition into magazines in the output side.

According to the present invention, a magazine inverting device for turning the magazine upside down is disposed between the input magazine stocker and the input magazine support station and an IC inverting device for turning IC elements to their one-sided, uninverted position is positioned between the testing station and the output magazine support station. With the construction of the present invention, it is possible that IC elements are discharged in the inverted disposition from the input magazine but received in the uninverted disposition in the output magazine through cooperation of the magazine inverting device and the IC inverting device.

Thus, the present invention offers IC test equipment which is easy to use.

DESCRIPTION OF THE PREFERRED EMBODIMENTS

Figure 1:
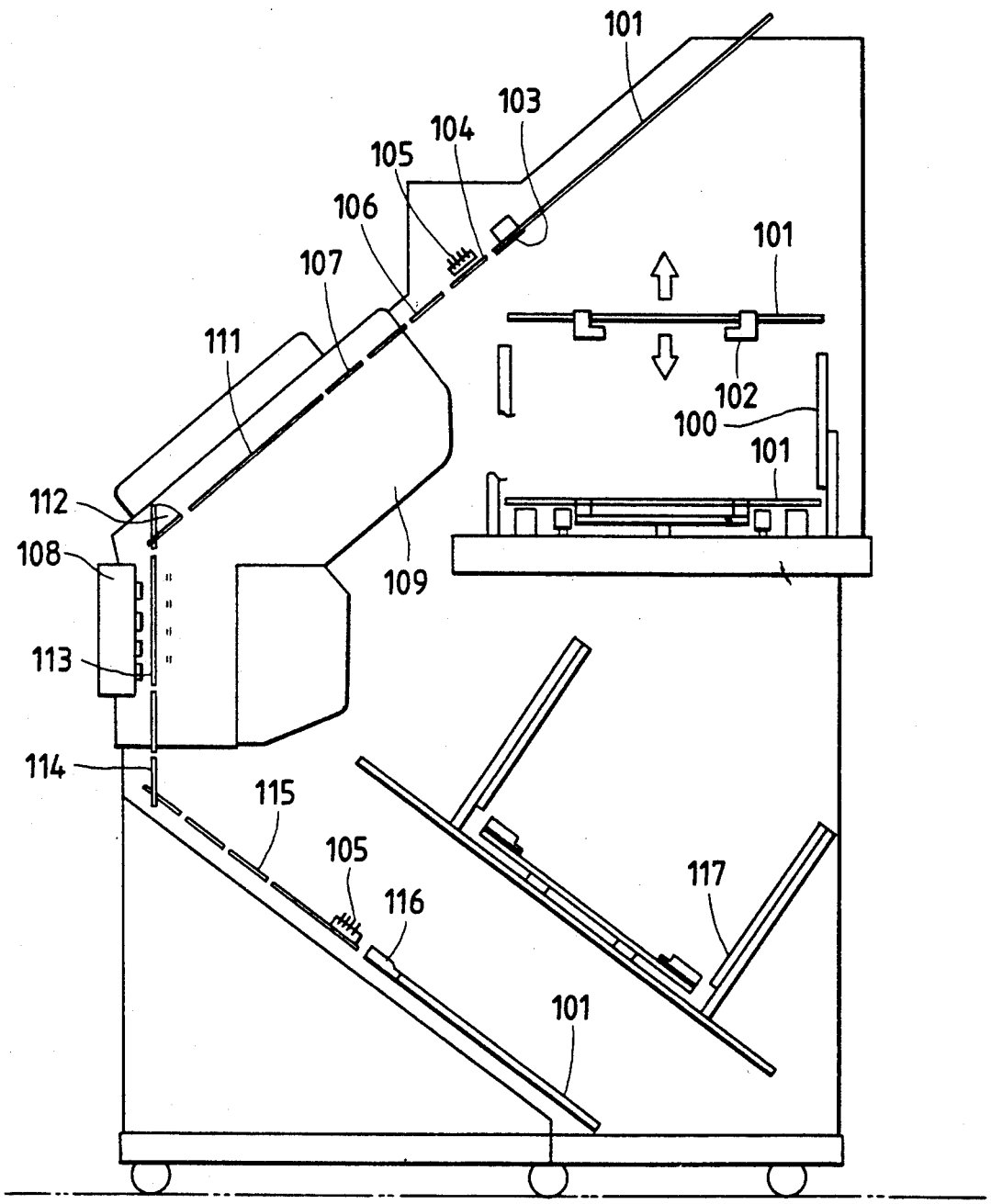
FIG. 1 is a side view for explaining the prior art.
Figure 9:
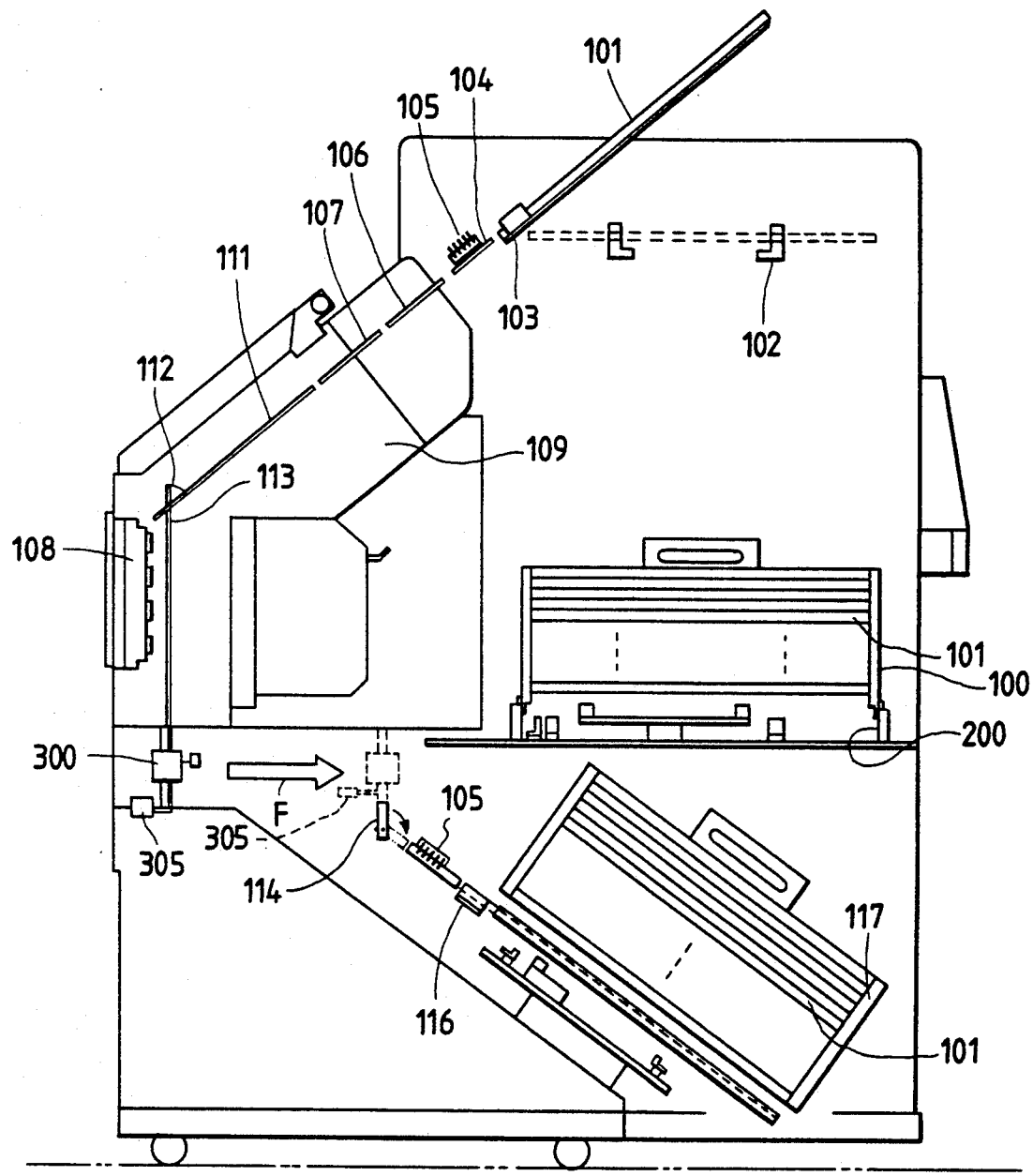
FIG. 9 is a side view illustrating an embodiment of the present invention.

FIG. 9 illustrates an embodiment of the present invention, in which the parts corresponding to those in FIG. 1 are identified by the same reference numerals.

In the present invention a magazine inverting device 200 for turning the magazine upside down is disposed on the magazine transfer passage between the input magazine stocker 100 and the input magazine support station 103, and an IC inverting device 300 for reversing the orientation of an IC element is disposed on the IC element transfer passage between the testing station 108 and the output magazine support station 116.

The input magazine stocker 100 and the output magazine stocker 117 are exactly identical in construction. When filled with magazines to capacity, the output magazine stocker 117 is dismounted from the output magazine support 116 and is then mounted as the input magazine stocker 100, so that the same IC elements can be tested for a plurality of times.

In the output magazine stocker 117 the magazines 101 are loaded so that they receive the IC elements 105 in the uninverted disposition. Hence, also in the input magazine stocker 100 the magazines 101 are loaded holding the IC elements 105 in the uninverted disposition. On this account, according to the present invention, the magazine inverting device 200 is provided for inverting the magazine 101 which has been discharged from the input magazine stocker 100.

Figure 10:
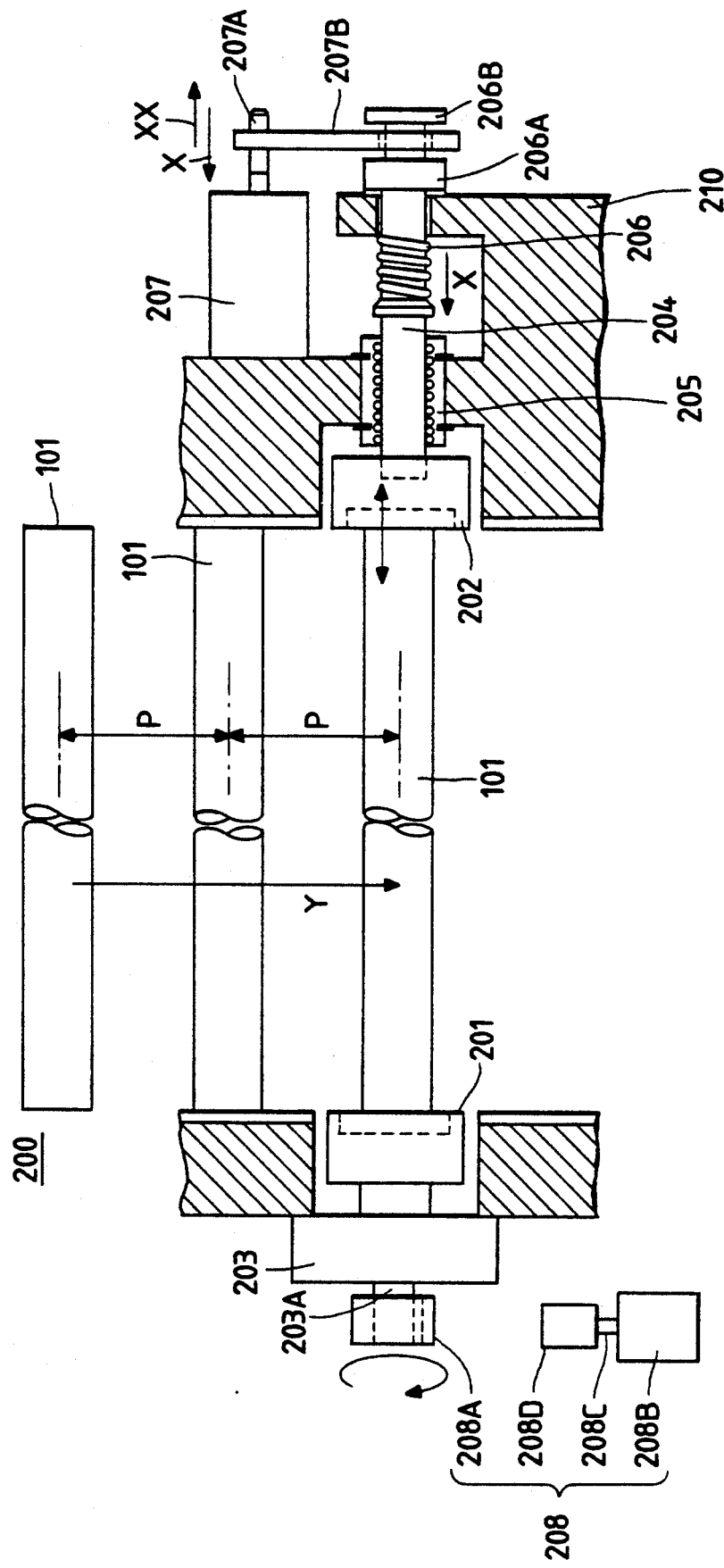
FIG. 10 is a plan view for explaining the construction of a magazine inverting device 200 for use in the present invention.

The magazine inverting device 200 has such a construction as shown in FIG. 10. In FIG. 10 the magazines 101 are arranged at regular intervals of their center-to-center distance (or pitch) P and are transferred pitch by pitch in the horizontal plane in the direction indicated by the arrow Y. Rotary discs 201 and 202 are disposed at both sides of one of standstill positions of the magazines 101. The one rotary disc 201 is attached to a rotary actuator 203. The other rotary disc 202 is attached to a clamp mechanism. The clamp mechanism can be composed of a thrust shaft 204, a bearing 205 for supporting the thrust shaft 204 rotatably and axially movable, a spring 206 for elastically urging the thrust shaft 204 in the direction indicated by the arrow X, and a cylinder 207 for thrusting the thrust shaft 204 in a direction reverse from the X-direction (i.e. in the direction indicated by the arrow XX) against the biasing force of the spring 206.

Figure 11:
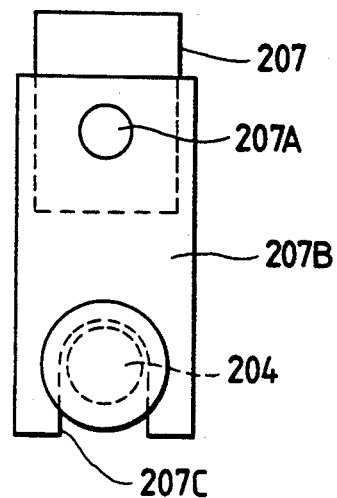
FIG. 11 is a schematic diagram showing coupling between a cylinder rod 207 and a thrust shaft 204 in FIG. 10.

The cylinder 207 is, for example, an air cylinder or electromagnetic cylinder and drives a rod 207A of the cylinder 207 in the X- and XX-directions. In FIG. 10 the cylinder 207 and the thrust shaft 204 are seen as if they are arranged in the horizontal direction, but in practice, they are arranged in the vertical direction as shown in FIG. 11. An arm 207B is secured to the rod 207A. The arm 207B has in its tip end a U-shaped recess 207C as shown in FIG. 11, with which the thrust shaft 204 is engaged. The thrust shaft 204 has two flanges 206A and 206B mounted thereon at both sides of the arm 207B. The flange 206A is fixed to a frame 210, through which the thrust shaft 204 is slidably disposed. The flange 206B is fixed to one end of the thrust shaft 204 and is pressed by the arm 207B to move the thrust shaft 204 in the direction indicated by the arrow XX.

Normally, the cylinder 207 urges the rod 207A in the XX-direction. In this state the rotary disc 202 stays away from the magazine transfer passage. When the magazine 101 has been brought to into opposing relation to the rotary discs 201 and 202, the cylinder 207 moves the rod 207A in the X-direction. In consequence, the thrust shaft 204 is moved by the biasing force of the spring 206 in the X-direction, holding the magazine 101 between the rotary discs 201 and 202. The rotary discs 201 and 202 are each deposited all over the surface of its one side with an elastic material such as rubber and elastically hold therebetween the magazine 101.

Figure 2:
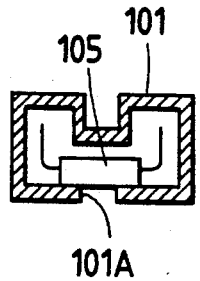
FIG. 2 is a sectional view for explaining inverted sliding of a DIP type IC element.
Figure 3:
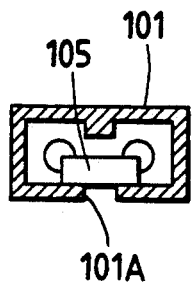
FIG. 3 is a sectional view for explaining inverted sliding of an SOJ type IC element.
Figure 4:
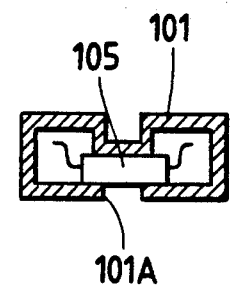
FIG. 4 is a sectional view for explaining inverted sliding of an SOP type IC element.
Figure 7:
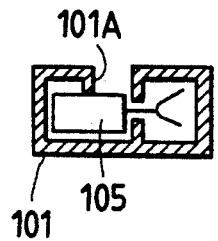
FIG. 7 is a sectional view for explaining a one-side sliding disposition of the ZIP type IC element.
Figure 8:
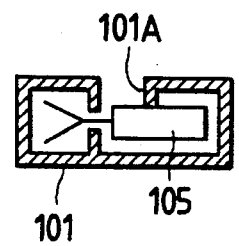
FIG. 8 is a sectional view for explaining another one-sided sliding disposition of the ZIP type IC element.

When the magazine 101 has been held between the rotary discs 201 and 202, the rotary actuator 203 is driven to turn the magazine 101 to a desired direction. That is, in the cases where the terminal pins of the IC elements 105 are the DIP type, the SOS type and the SOP type as shown in FIGS. 2 through 4, the magazine 101 is turned 180 degree. On the other hand, in the case of the ZIP type, the IC elements 105 are loaded in the one-sided, uninverted disposition as depicted in FIGS. 7 or 8, and therefore to change the one-sided disposition to the inverted disposition shown in FIGS. 5 and 6, it is necessary to turn the magazine 101 +90 or −90 degrees. It is a rotational angle selecting device 208 that controls whether the magazine 101 is turned 180 or 90 degrees. The rotational angle selecting device 208 includes a rotational angle select disc 208A mounted on the rotary shaft 203A of the rotary actuator 203 and a cylinder 208B.

Figure 12:
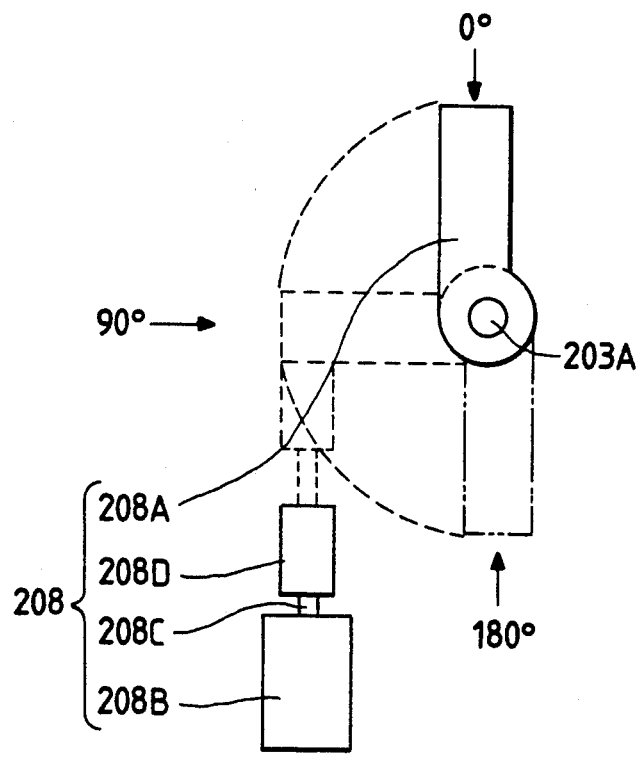
FIG. 12 is a schematic diagram showing the relationship of a rotational angle selecting device 208 to an actuator shaft 203A in FIG. 10.

The rotational angle select disc 208A is fixedly mounted as a rotary arm on the rotary shaft 203A as depicted in FIG. 12. At the home position where the cylinder 208B has fully retracted its rod 208C, the rotational angle select disc 208A can turn from a 0° position to a 180° position. In contrast thereto, when the rod 208C of the cylinder 208B has been fully extended, the rotational angle select disc 208A turns from the 0° degree position to the 90° position and strikes against a stopper 208D there, and hence its rotational angle is limited to 90 degrees. It is also possible to turn the rotational angle select disc 208A from the 0° position to the 90° position to obtain a rotational angle of −90 degrees.

By the magazine inverting device 200 described above, the magazine 101 discharged from the input magazine stocker 100 is turned 180 or 90 degrees, whereby the IC elements loaded in the magazine 101 are turned upside down and are loaded in the inverted disposition in the input magazine support station. Consequently, the IC elements 105 can be discharged in the upside down disposition into the IC input port 104.

Figure 13:
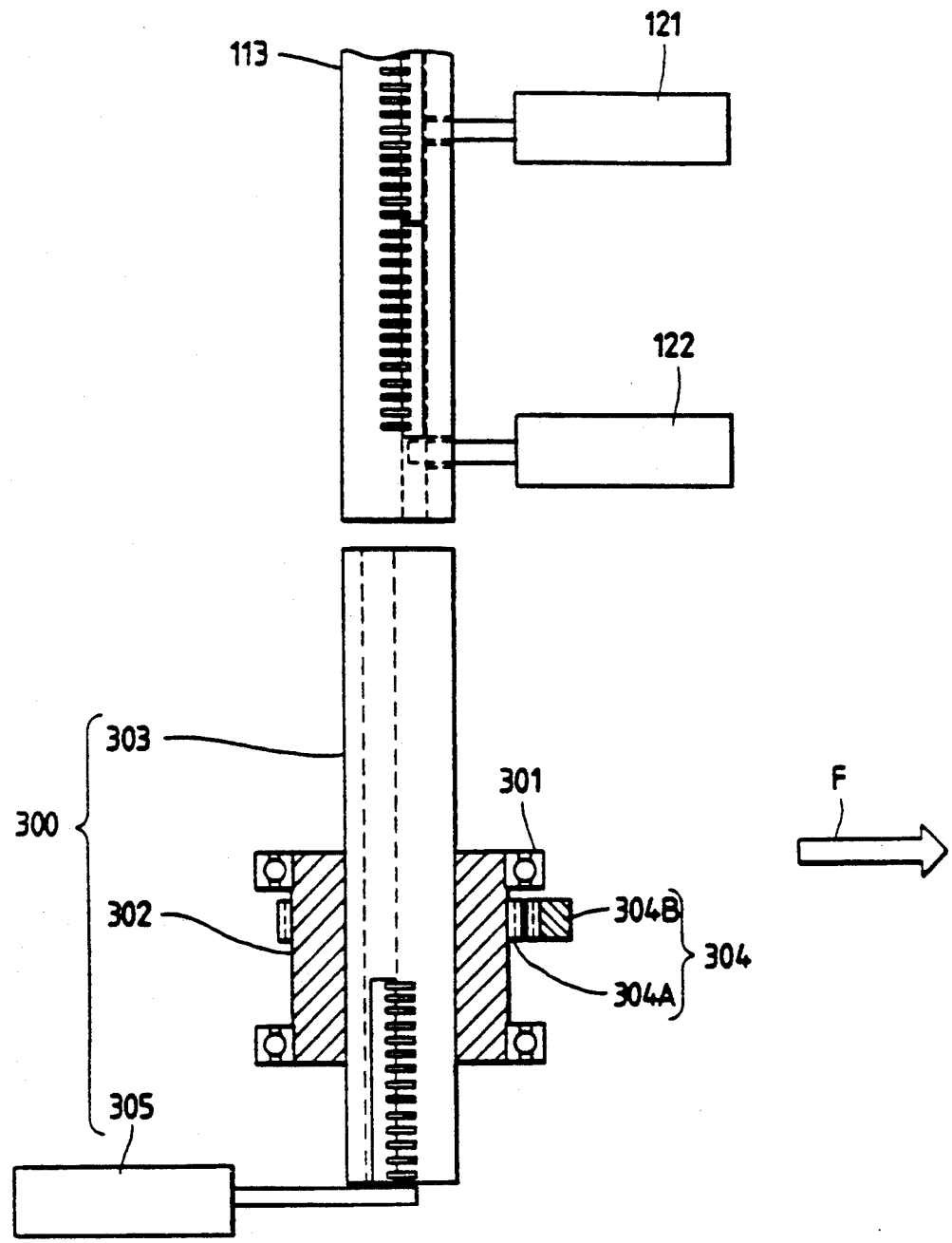
FIG. 13 is a side view for explaining the construction of an IC inverting device 300 for use in the present invention.

On the other hand, the IC inverting device 300 provided between the testing station 108 and the output magazine support station 116 can be constructed as shown in FIG. 13, for instance. Two cylinders 121 and 122 are provided downstream of the testing station 108. The cylinder 121 and 122 operate alternately with each other, by which the IC elements 105 are supplied one by one to the IC inverting device 300. The IC inverting device 300 can be formed by a cylindrical member 302 rotatably supported by bearings 301, a guide rail 303 disposed through the cylindrical member 302, supported in the vertical direction and loadable with a plurality of IC elements, a driver 304 for driving the cylindrical member 302, and a stopper cylinder 305 provided at the lower end portion of the guide rail 303.

The driver 304 can be formed by a gear 304A mounted on the peripheral surface of the cylindrical member 302 and a rack 304B which meshes with the gear 304A to turn the cylindrical member 302. Incidentally, for example, eight guide rails 303 are disposed in parallel in the same plane and are simultaneously turned by one rack 304B. By controlling the distance of travel of the rack 304B, the guide rails 303 can be turned either of 180 and 90 degrees as desired. Accordingly, in the cases of the DIP type, SOJ type and SOP type IC elements depicted in FIGS. 2 to 4, the guide rails 303 are turned 180 degrees about their lengthwise directions.

Figure 14:
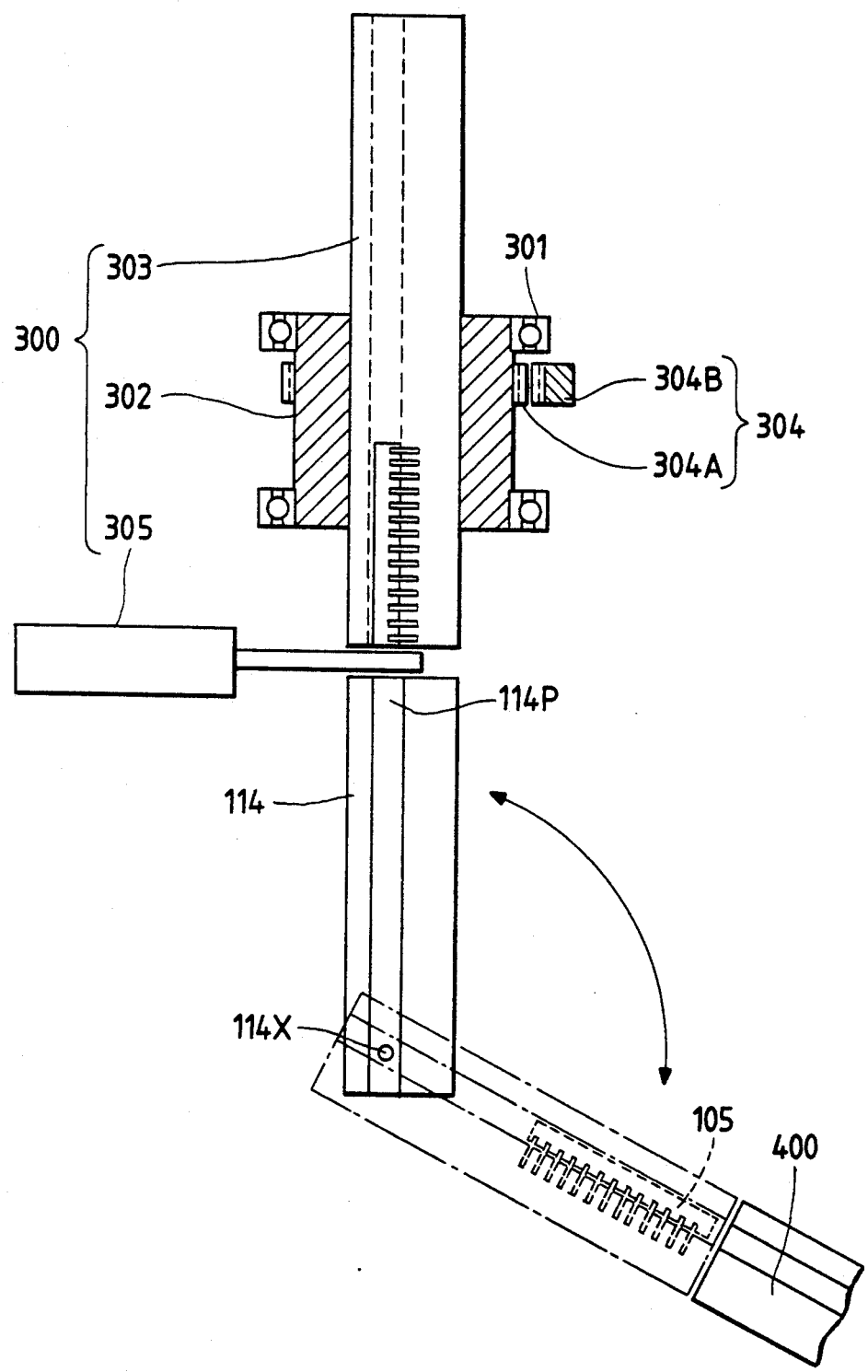
FIG. 14 is a front view for explaining the operation of an IC diverter 114 in association with the IC inverting device 300 moved thereto.

In this embodiment, after the IC elements have been rotatively reoriented, the IC inverting device 300 moves laterally in a direction indicated by the arrow F to a position above the IC diverter 114. The IC diverter 114 is formed by rails similar to the guide rails 303. As shown in FIG. 14, when the guide rail 303 and the IC diverter 114 have been brought into axial alignment with each other, the stopper cylinder 305 is actuated, by which the IC element 105 is dropped onto the IC diverter 114. The IC diverter 114 turns about a rotary shaft 114X provided at the end portion on the opposite side from an IC input/output port 114P, so that the IC element 105 loaded onto the diverter 114 from the guide rail 303 through the input/output port 114P is discharged onto an output guide rail 400 through the same input/output port 114P. Thus, the orientation of the IC element 105 relative to the direction of its feed is reversed and the IC element 105 slides on the guide rail 400 in the uninverted disposition.

Figure 5:
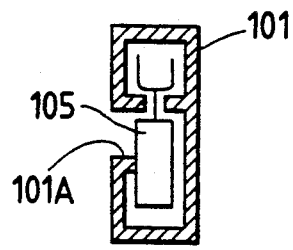
FIG. 5 is a sectional view for explaining inverted sliding of a ZIP type IC element.
Figure 6:
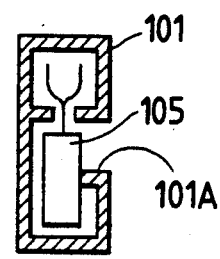
FIG. 6 is a sectional view for explaining another inverted sliding disposition of the ZIP type IC element.

On the other hand, in the case of the ZIP type IC element depicted inverted in FIGS. 5 and 6, it is turned by the IC inverting device 300 through 90 degrees in the plus or minus direction, depending on which side of the IC body bears its name. In either case, the ZIP type IC element is turned 90 degrees and is discharged onto the guide rail 400 in the one-sided, uninverted disposition shown in FIGS. 7 or 8.

As described above, according to the present invention, the magazine inverting device 200 and the IC inverting device 300 are provided by which IC elements are fed in the normal, one-sided uninverted disposition at the output side and are discharged in that disposition into the magazine 101 so that the name of each IC element loaded on the magazine 101 can be seen through its slit-like window 101A, but at the input side, i.e., at the input magazine stacker the IC elements can be fed in the inverted disposition.

Accordingly, at the input side of IC test equipment for testing various kinds of IC elements, the IC elements are all fed in the inverted disposition. Hence, the present invention offers IC test equipment in which the IC elements are rarely caught by the passages.

It will be apparent that many modifications and variations may be effected without departing from the scope of the novel concepts of the present invention.

What is claimed is:

1. IC test equipment, comprising:
   input magazine stocker means for holding and discharging a number of magazines each carrying IC elements to be tested;
   input magazine support station means for supporting said magazines discharged from said input magazine stocker means one after another and for providing said IC elements carried therein to a testing station;
   output magazine support station means for supporting said magazines and for receiving into said magazines IC elements tested in said testing station;
   magazine inverting means provided on a path between said input magazine stocker means and said input magazine support station means, for inverting each of said magazines and said IC elements carried therein; and
   IC inverting means provided on a path between said output magazine support station means and said testing station, for inverting said IC elements, said IC inverter means comprising:
      IC rotating means for receiving said IC elements in a lengthwise direction from said testing station and for rotating said IC elements an angle selected from 90 to 180 degrees about an axis parallel to a direction which said IC elements travel on the path between said output magazine support station means and said testing station; and
      IC diverter means for turning said IC elements about an axis perpendicular to said direction which said IC elements travel;
   wherein said magazine support station means provides said IC element from said magazine in an inverted disposition and said output magazine support station means receives said IC elements into said magazine means in an uninverted and one-sided disposition.

2. The IC test equipment of claim 1, wherein said magazine inverting means comprises:
   holding means whereby each of said magazines discharged from said input magazine stocker means one after another is held at both of two ends in a lengthwise direction;
   rotary actuator means for rotating said holding means and the magazine held therein within an angular range of between 0° and 180°; and
   rotational angle select means for selectively stopping the rotation of said holding means at a rotational angle of 90°.

3. The IC test equipment of claim 1, wherein said IC rotating means comprises:

a guide rail for receiving and holding a plurality of said IC elements from said testing station;

a cylindrical member for holding said guide rail and turning said guide rail about the axis parallel to said direction which said IC elements travel; and drive means for turning said cylindrical member to thereby turn said guide rail about the selected angle.

4. The IC test equipment of claim 3, wherein a plurality of guide rails and cylindrical members are provided, said guide rails being arranged in parallel in the same plane, said cylindrical members having gears respectively provided on outer peripheral surfaces of said cylindrical members and said drive means having a rack respectively meshing with each of said gears of said cylindrical members and linearly moving in a lengthwise direction to thereby turn each of said gears and each of said guide rails simultaneously.

5. The IC test equipment of claim 1, wherein said IC diverter means includes a rail which has an input/output port at a first end thereof for receiving and discharging IC elements, said rail being turnable about a shaft provided at a second end thereof opposite the first end, when said rail has received at least one of said IC elements from said IC rotating means through said input/output port, said rail turns to discharge said at least one of said IC elements through said input/output port to one of said magazines held at said output magazine support station means.

* * * * *